(12) United States Patent
Beck et al.

(10) Patent No.: US 6,690,398 B1
(45) Date of Patent: Feb. 10, 2004

(54) LOGIC ANALYZER WITH MIXED TEXTUAL AND GRAPHICAL TRIGGER SPECIFICATION

(75) Inventors: Douglas James Beck, Colorado Springs, CO (US); Michael Shaun Backsen, Westcliffe, CO (US); Douglas Fred Robison, Colorado Springs, CO (US); John Howard Friedman, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/492,508

(22) Filed: Jan. 27, 2000

(51) Int. Cl.[7] ................................................. G06F 3/14
(52) U.S. Cl. ..................... 345/771; 345/763; 345/764; 345/835; 345/769; 345/839; 702/57; 702/66; 702/67
(58) Field of Search ............................... 345/440.1, 771, 345/773, 965, 835, 839, 769; 702/57, 66, 67, 68, 117

(56) References Cited

U.S. PATENT DOCUMENTS

| | | | | | |
|---|---|---|---|---|---|
| 5,371,851 | A | * | 12/1994 | Pieper et al. | 345/501 |
| 5,778,328 | A | * | 7/1998 | Trsar et al. | 324/379 |
| 5,953,009 | A | * | 9/1999 | Alexander | 345/440 |
| 6,054,984 | A | * | 4/2000 | Alexander | 345/440 |
| 6,327,544 | B1 | * | 12/2001 | Samuels | 345/501 |

* cited by examiner

Primary Examiner—Steven Sax
Assistant Examiner—Thomas T. Nguyen
(74) Attorney, Agent, or Firm—Edward L. Miller (57) ABSTRACT

A logic analyzer integrates the capabilities of both textual and graphical description into a common environment, so that each can be used as needed, and in conjunction with the other. In an example embodiment a trigger specification can comprise many "steps". A step can be conceptualized as an atomic segment of flow charting that involves or investigates a quantity or condition of interest. These steps may involve testing, and a decision concerning whether or not to trigger or whether or not to advance to a next step. A given step can be either textual or graphical. A GUI (Graphical User Interface, as in computer windows, and not to be confused with 'graphical' meaning 'waveform-like') on a CRT screen in conjunction with a pointing device (e.g., mouse) provides the presentation of the integrated textual and graphical (waveform-like) trigger specification steps.

1 Claim, 6 Drawing Sheets

FIG. 1A
(TEXTUAL PRIOR ART)

FIG. 2A
(GRAPHICAL PRIOR ART)

LOGIC ANALYZER WITH MIXED TEXTUAL AND GRAPHICAL TRIGGER SPECIFICATION

REFERENCE TO RELATED APPLICATIONS

The subject matter of the present case is related to that which is disclosed in two previously filed cases. These cases are (1): Ser. No. 09/432,840, filed Oct. 29, 1999 by Beck, Backsen, Robison and Friedman and entitled SYSTEM AND METHOD FOR DEFINING AND GROUPING SIGNALS AND BUSES OF A SIGNAL MEASUREMENT SYSTEM USING SELECTION LISTS ON A GRAPHICAL USER INTERFACE; and, (2) Ser. No. 09/261,313, filed Mar. 1, 1999 by Beck, Roeca, Griggs, Haeffele and Samuels and entitled AN INTEGRATED TRIGGER FUNCTION DISPLAY SYSTEM AND METHODOLOGY FOR TRIGGER DEFINITION DEVELOPMENT IN A SIGNAL MEASUREMENT SYSTEM HAVING A GRAPHICAL USER INTERFACE. These two U.S. Patent Applications are hereby expressly incorporated herein by reference.

BACKGROUND OF THE INVENTION

Logic analyzers are test equipment that allow inspection of patterns ("logic states") in logic signals, and detect the occurrence therein of selected events. Early equipment that met this definition operated upon serially transmitted data, such as the bits of characters being sent via RS-232 or register contents being sent over serial busses in a serial micro-processor environment. At present, serial microprocessors are less prevalent than their parallel counterparts, although the serial bit-wise transmission of data continues in many forms (e.g., Internet protocol over an Ethernet), and the term "logic analyzer" has generally come to refer to equipment that deals with data occurring in parallel form (as on a sixty-four bit wide bus). The task of serial data analysis has been undertaken by "serial data analyzers" and protocol analyzers. Despite this divergence, many of the fundamental concepts remain the same or quite similar (e.g., the notion of triggering), and despite that fact that our examples are presented in the realm of parallel data, it will nonetheless be appreciated that the techniques described below have applicability in the serial environment as well as in the parallel one. This is not surprising when one considers that today, a post acquisition processing facility that provides serial data analysis capability is often sold as an accessory or option to a parallel logic state analyzer.

From their humble beginnings of eight channels of data and memories of only sixteen states in depth, (parallel data) logic analyzers have evolved into powerful and sophisticated systems that can monitor hundreds of channels and store tens of millions of states, collectively called a trace, which is stored in a trace memory. However, such a wealth of data is valuable only if events of interest are not obscured by the sheer number of other events that might be recorded in the trace memory. While post acquisition analysis of the trace is always a possibility, a more efficient solution to this potential dilemma takes the form of ways to initially exclude from storage events that are deemed uninteresting. Storage qualification and triggering are two ways that this is done. Storage qualification restricts what events that are placed into memory to those that meet some standing criteria; e.g., data read from a certain address in memory. Being finite, the memory may eventually be filled, whereupon it is treated as circular and new data overwrites the oldest data. Triggering, on the other hand, is used to recognize the occurrence of some condition believed to be THE EVENT OF INTEREST, and subsequently terminate (immediately or eventually) the data acquisition phase of the measurement (lest the event of interest be overwritten by subsequently acquired data). The stored data of the trace may be likened to a list, and if the trigger event were used in such a way that it occurs at the middle of the completed trace list, then subsequent examination of the trace list would reveal events that led up to the trigger event, as well as those that happened afterwards. It is customary to be able to specify where in the trace list the trigger is to appear, and it is prominently identified as such in the list.

Capturing the desired data frequently hinges on being able to specify a sufficiently meaningful trigger condition. That is, the desired trigger condition (the trigger specification) might be a fairly complicated sequence of events, perhaps even involving alternatives. Often that task of trigger specification development is problematic, since, if one knew what was wrong there would likely be no need to specify a trigger in the first place. But given that there is an unknown problem, one is sometimes forced to discover an effective trigger specification by successive refinement, even with the aid of powerful trigger techniques. This has led to the development of many useful triggering schemes, to which logic analyzers owe much of their present utility.

Initially, trigger specifications were described in boolean terms, using signal names associated with factory assigned input channel names belonging to the analyzer itself, rather than using names associated with the system being investigated. In due course logic analyzers changed to allow the user to specify that certain inputs to the analyzer were to be treated as a field identified by a name, usually called a label. Thus, the operator became free to describe events in terms of more meaningful descriptors, such as ADDR (referring to a defined collection of thirty-two inputs representing an address), DATA (another user defined collection of inputs) and READ (a single bit control line). Once these correspondences are established the associated labels may be treated as variables, allowing the formation of relationships such as ADDR=XXXXXXXX$_{16}$. A trigger specification is an assemblage of labels used as operands in conjunction with various logical operators, such as AND, OR and NOT, possibly including parenthesis, and forming logical expressions with constants (fixed values) and the relations =, < and >. Labels are much easier to work with than, say, logic analyzer channel numbers, since they are descriptive in terms of the system being investigated. Such a textual boolean description of a trigger specification resembles a segment of programming, perhaps similar to C. The HP 1670 series Logic State Analyzers are representative of this textual mode of trigger specification. Handy as it is, however, the textual boolean representation can also sometimes be difficult to create correctly, particularly when elaborate sequences in time are involved. Not all users are comfortable with such a textual description, especially when timing or duration relationships between signals are to be expressed.

Occasional severe dissatisfaction with the textual symbolic boolean trigger specifications have led to the development of graphical methods of trigger specification. These techniques represent logic signals as logic waveforms, and the user specifies what waveform (or related family of waveforms) constitutes the trigger specification. This mode of description is, for many users, a more natural mode of expression for describing certain kinds of relationships between signals of interest. The Agilent 9340A is an example of a logic analyzer having a graphical mode of trigger specification.

The two trigger specification methods, textual and graphical, are generally considered to be philosophically equivalent in terms of capability, in that what can be done with one technique can usually be done with the other. That said, however, one is not obliged to consider them equally easy to use in all situations. Some trigger specification situations are more easily handled (by at least some users) with a textual description, and others with graphical one. Prior art logic analyzers have forced the user to choose between the two methods. It would be desirable if it were possible to combine, within a single trigger specification, the advantages of both methods, as indicated by the nature of the problem.

SUMMARY OF THE INVENTION

A solution to the problem of an inappropriate trigger specification mechanism in a logic analyzer is to integrate the capabilities of both textual and graphical description into a common environment, so that each can be used as needed, and in conjunction with the other. In an example embodiment to be described a trigger specification can comprises as many as six "steps". A step can be conceptualized as an atomic segment of flow charting that involves or investigates a quantity or condition of interest. These steps may involve testing, and a decision concerning whether or not to trigger or whether or not to advance to a next step. A given step (as defined above) can be either textual or graphical. A GUI (Graphical User Interface, as in computer windows, and not to be confused with 'graphical' meaning 'waveform-like') on a CRT screen in conjunction with a pointing device (e.g., mouse) provides the presentation of the integrated textual and graphical (waveform-like) trigger specification steps.

DESCRIPTION OF A PREFERRED EMBODIMENT

Figure 1A:
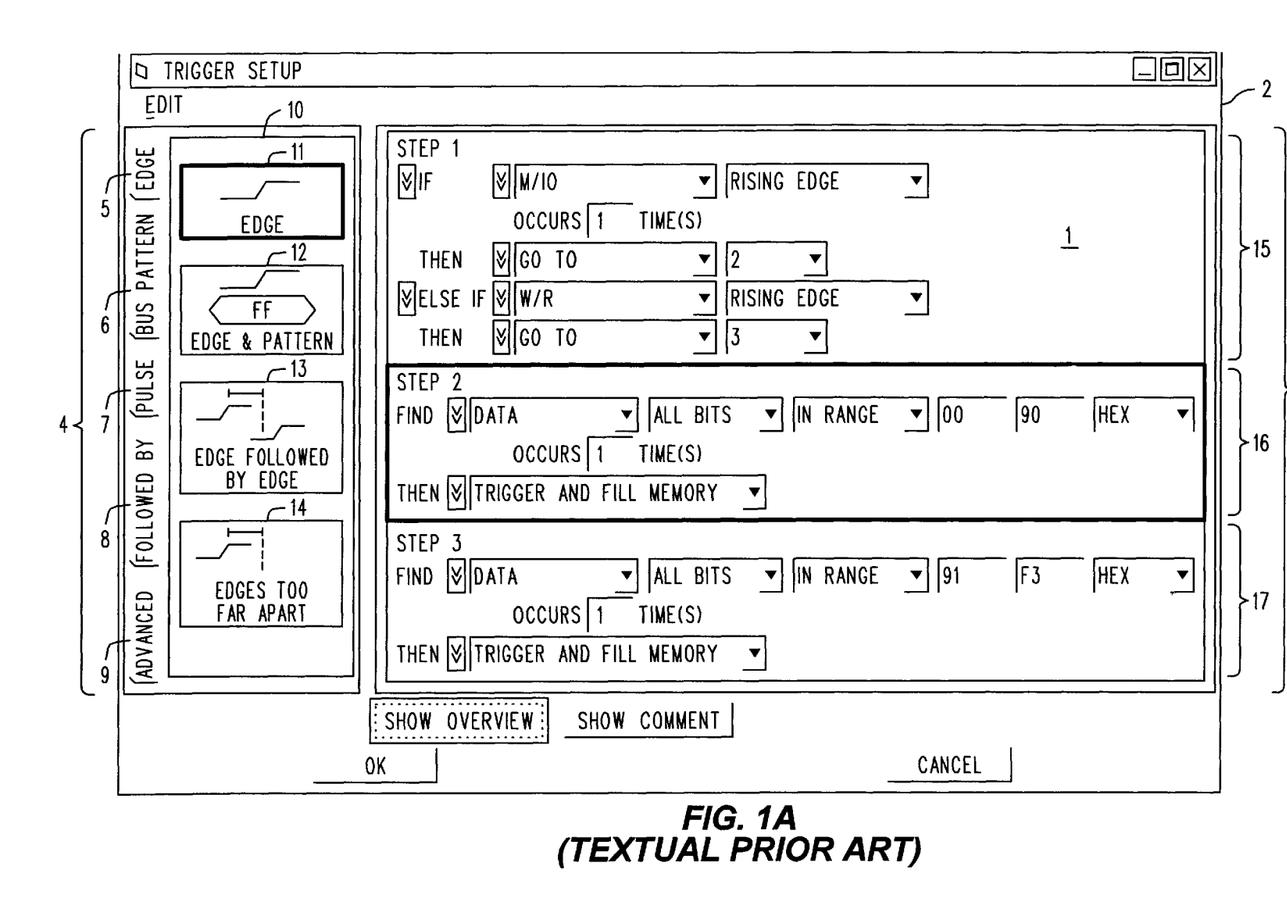
FIG. 1A is a representation of a GUI screen image for a prior art textual trigger specification technique in a logic analyzer.
Figure 1B:
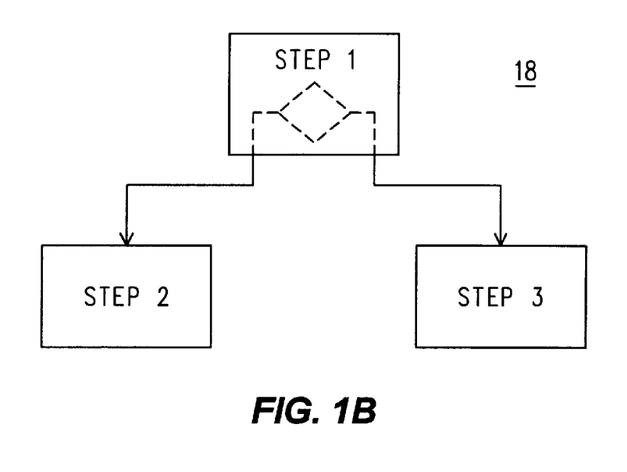
FIG. 1B is a schematic flow chart segment indicating logical the structure of a decision making process performed by the textual trigger specification of FIG. 1A.

Refer now to FIGS. 1A and 1B. FIG. 1A is a representation of a GUI screen image 1 for a prior art textual trigger specification technique used in a logic analyzer. The screen image 1 comprises a window 2 which includes a portion 3 having a list of steps (15, 16, 17) that are the actual trigger specification. Also included in the window 2 is a region 4 that comprises tabs 5–9 and a collection 10 of icons (or buttons with labels formed of text and or images). The particular collection of icons present in region 4 depends upon which of tabs 5–9 has been clicked upon a screen pointer (not shown). The different tabs represent various categories of signal activity that might be of interest in constructing a trigger specification. In principle, all icons could be visible at once in region 4, except that as a practical matter there are so many that the screen image 1 would appear cluttered; hence they are instead grouped by functional category, and made visible as needed. In FIG. 1A the icons 11–14 visible in region 4 correspond to the edge tab 5. Clicking on a different tab would make a different collection of icons visible.

An icon visible in region 4 can be dragged and dropped into region 3, whereupon it creates a corresponding step in the trigger specification. The figure shows three existing steps it names STEP 1 (15), STEP 2 (16) and STEP 3 (17). If the icon is dropped between two existing steps it inserts a new step between them. Likewise, if it is dropped before or after an existing sequence of steps it adds a new step before or after the existing steps, respectively. (A step is deleted in accordance with any of the usual and customary methods for that in the Microsoft Windows environment. For example: highlight the step and then press the Delete key; or, right click while the screen pointer is within the step and choose Delete from the menu that appears.) A step is described by a menu having a certain structure based on the meaning associated with the icon and that is reflected in various fields and buttons that form the menu. Initially, some fields (such as ones that accept user defined labels for input channels) may be blank, while mode specification indicators may be set to default values. In any event, once a step has been put in place, the user fills out the menu therein. Some of the information supplied may link steps together in a sequence conditioned upon possible events. So, for example, STEP 1 indicates conditions under which the next step will be STEP 2 and those for which the next step will instead be STEP 3. The resulting linked sequence of steps is equivalent to a flow chart, and in some prior art analyzers that flow chart can be automatically produced upon request. FIG. 1B is a generalized such flow chart 18 for FIG. 1A.

Figure 2A:
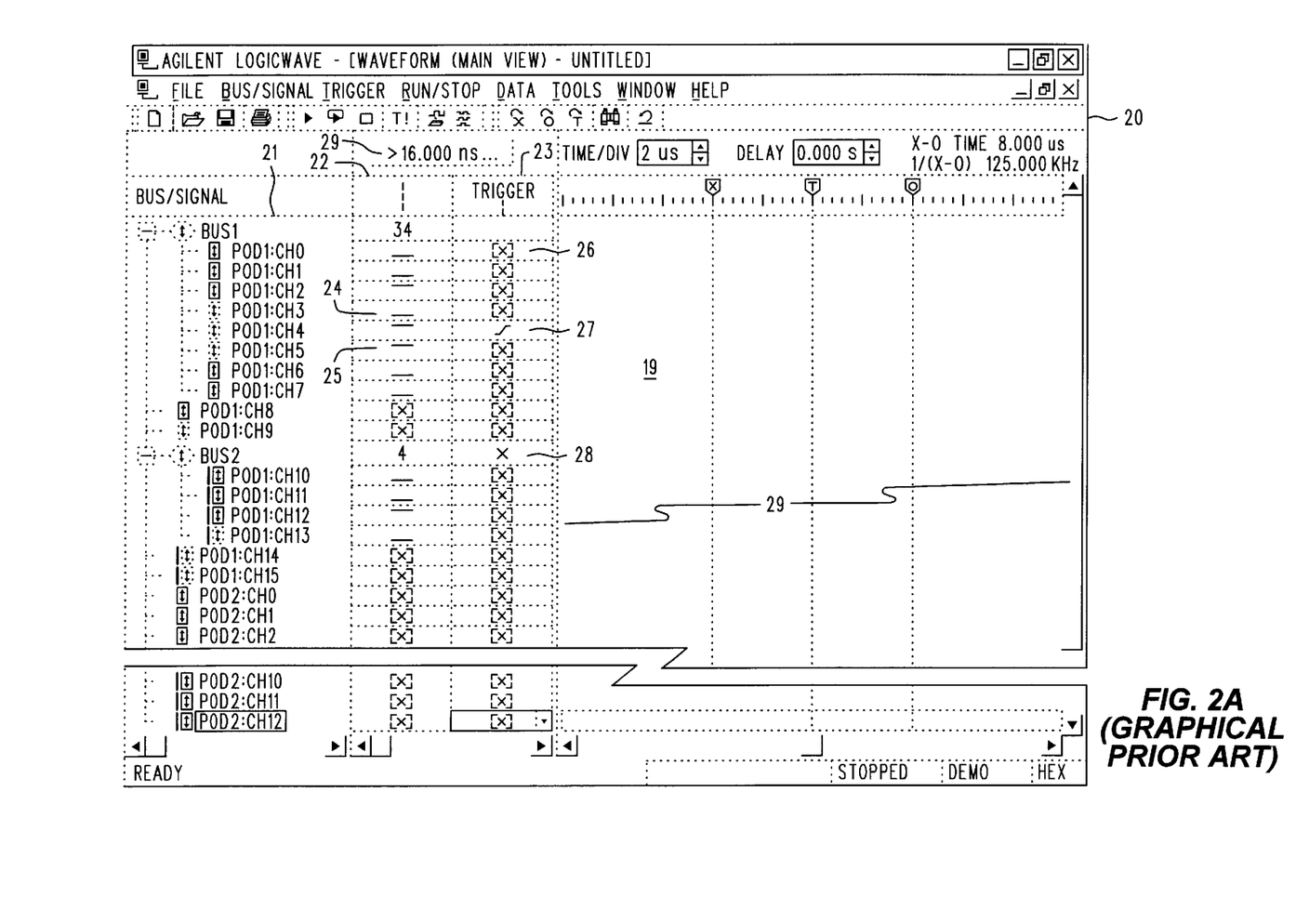
FIG. 2A is a representation of a GUI screen image for a prior art graphical trigger specification technique in a logic analyzer.
Figure 2B:
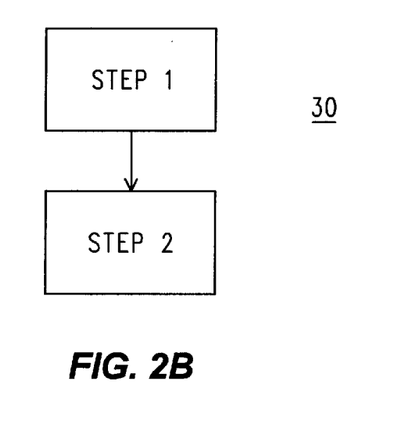
FIG. 2B is a schematic flow chart segment indicating logical the structure of a decision making process performed by the graphical trigger specification of FIG. 2A.

Refer now to FIGS. 2A and 2B. FIG. 2A is a representation 19 of a GUI screen image for a prior art graphical (waveform related) trigger specification technique used in a logic analyzer. The screen image 19 comprises a window 20 which includes a portion 21 listing signals available for use in the trigger specification and also includes portions 22 and 23, which form a two step trigger specification. In the example of FIG. 2A regions 22 and 23 are columns of various symbols having useful meanings. For example, symbol 24 in region 22 indicates that channel 3 on pod 1 is to be low, while symbol 25 indicates that channel 5 on pod is to be high. Step 1 (defined by region 22) is formed of several such indications, as shown in the column. Legend 29 indicates that the condition defined by region 22 must last for more than sixteen nanoseconds. Step 2 (region 23) requires that there be a rising edge on channel 4 of pod 1 (symbol 27), and that all the other signals are don't cares. This is indicated for the remaining signals of the label Bus 1 by the various bracketed X's (26). The solid X 28 is a shortcut way to indicate all of the signals within the label Bus 2 are don't cares. To the right of the trigger specification appears a region 29 within which will appear waveform diagrams drawn in the fashion of a timing analyzer once data has been acquired and the analyzer has been triggered.

FIG. 2B illustrates the generalized equivalent flow chart 30 of the regions 22 and 23 in FIG. 2A that form the two step trigger specification.

The reader who wishes to know the details of how such GUI's as those shown in FIGS. 1A and 2A can control the operation of a logic analyzer is referred to the incorporated Patent Applications. Both have comprehensive block diagrams and extensive hardware and software system descriptions that relate the control of an instrument (e.g., a logic analyzer) to interaction with a GUI via a display and a pointing device, such as a mouse.

It will also be clear to those skilled in the art that the textual and graphical modes of controlling trigger specification, as well as the combined one to be described below, are in general applicable to other forms of triggered signal acquisition equipment besides logic analyzers, including but not limited to, timing analyzers, protocol analyzers and digital oscilloscopes.

Figure 3:
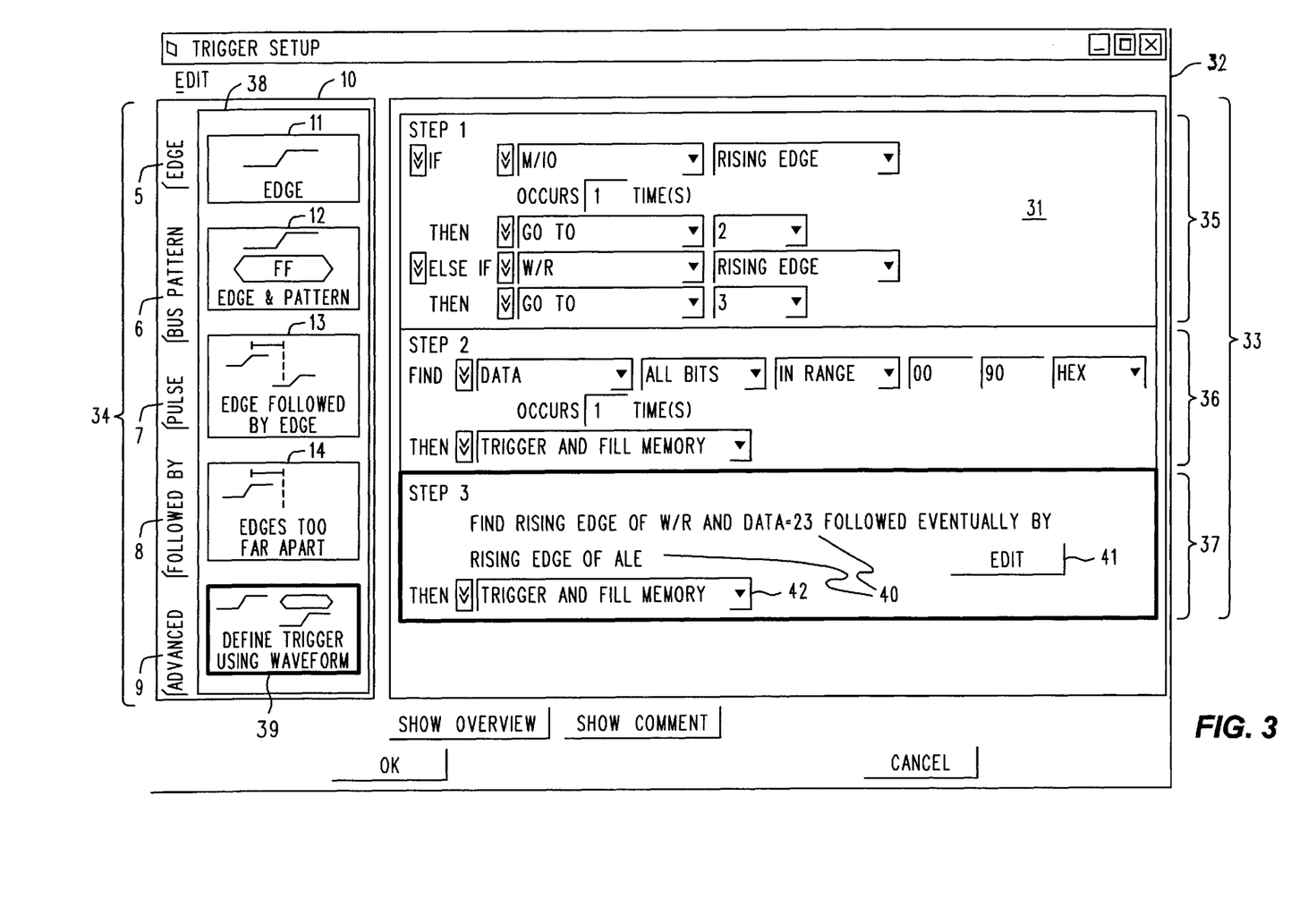
FIG. 3 is a representation of a GUI screen image for a logic analyzer trigger specification technique that allows the intermixing of steps described in a textual manner and steps described in a graphical manner.

Refer now to FIG. 3, wherein is shown a representation of GUI screen image 31 for defining a trigger specification in a logic analyzer. The screen image 31 comprises a window 32 which includes a portion 33 having a list of steps (35, 36 and 37) that are the actual trigger specification. The embodiment of FIG. 3 allows the intermixing of textually defined and graphically defined (i.e., waveform like) trigger specification steps. In the particular example shown in FIG. 3, steps 35 and 36 are textual, while step 37 was defined in a waveform like (graphical) manner. (To be sure, step 37 in FIG. 3 is a text legend. However, that legend is a non-editable summary and appears after the actual definition activity, which is quite graphical and is discussed in connection with FIG. 4.) To continue, the embodiment of FIG. 3 includes many of the features explained in connection with FIG. 1A, which accordingly have been assigned the same reference characters, where appropriate. Also included in the window 32 is a region 34 that comprises tabs (5–9) and a collection 38 of icons (11–14 and 39). As before, the members of this collection 38 may be just icons, or, buttons or other outlined regions of the screen image that contain images and or text that identify their function. In a known fashion, they are each a "control" that does something when the pointing device positions the screen pointer (not shown) within their respective boundaries and is subsequently clicked, or preferably, when they are dragged to a meaningful location in the list area 33 and then dropped.

Accordingly, the screen image 31 results from having defined two textual steps 35 and 36 by methods described in connection with FIG. 1A. Step 37 is a graphically defined step whose principal meaning or condition is indicated with words (40), but which was initially defined graphically by way of the graphical (waveform) editor screen 43 of FIG. 4. Notice we did not say that the principal meaning or condition is indicated textually; it is in words, but the format of the indication 40 differs from that of Step 1 and Step 2, in that there are no selection boxes whose content can be scrolled to make a choice. Indication 40 is a summarized readable legend reflecting the waveform definition activity performed with screen 43. Step 3 (37) can be altered if need be, but not by manipulating the characters that appear in indication 40. Instead, the Edit button 41 must be clicked on, which then returns a filled out graphical (waveform) editor screen 43 of FIG. 4. That screen is then altered as needed, and the OK button 45 clicked when the edit is complete. A FIG. 3 like screen then reappears, whose region 37 reflects the changes made using the graphical editor screen 43.

Here is the process in more detail. Icon 39 (Define trigger using waveform) was dragged into the list area 33 and then dropped. It might have been dropped there prior to the definition of Step 1 and Step 2, (in which case Step 3 started out as Step 1 and two new steps were later inserted ahead of it), or Step 1 and Step 2 were specified first, followed by Step 3. Alternatively, Step 3 could have initially followed Step 1 (it would have been Step 2) and what is now Step 2 inserted between them. However the sequence was earlier created, at the time the icon 39 was dropped into the list area 33 graphical editor screen 43 of FIG. 4 then appeared, was subsequently filled out, and its OK button 45 clicked. The graphical editor screen 43 then disappeared and the screen 32 of FIG. 3 appeared. If, during the presence of the graphical editor screen 43 the operator reconsiders the merits or the changes made during the edit, he or she can click on the Cancel button instead of OK to end the edit session without making any changes. To delete Step 3 the operator would return to the screen 31 of FIG. 3 and use any of the Microsoft Windows based deletion mechanisms mentioned earlier.

Figure 4:
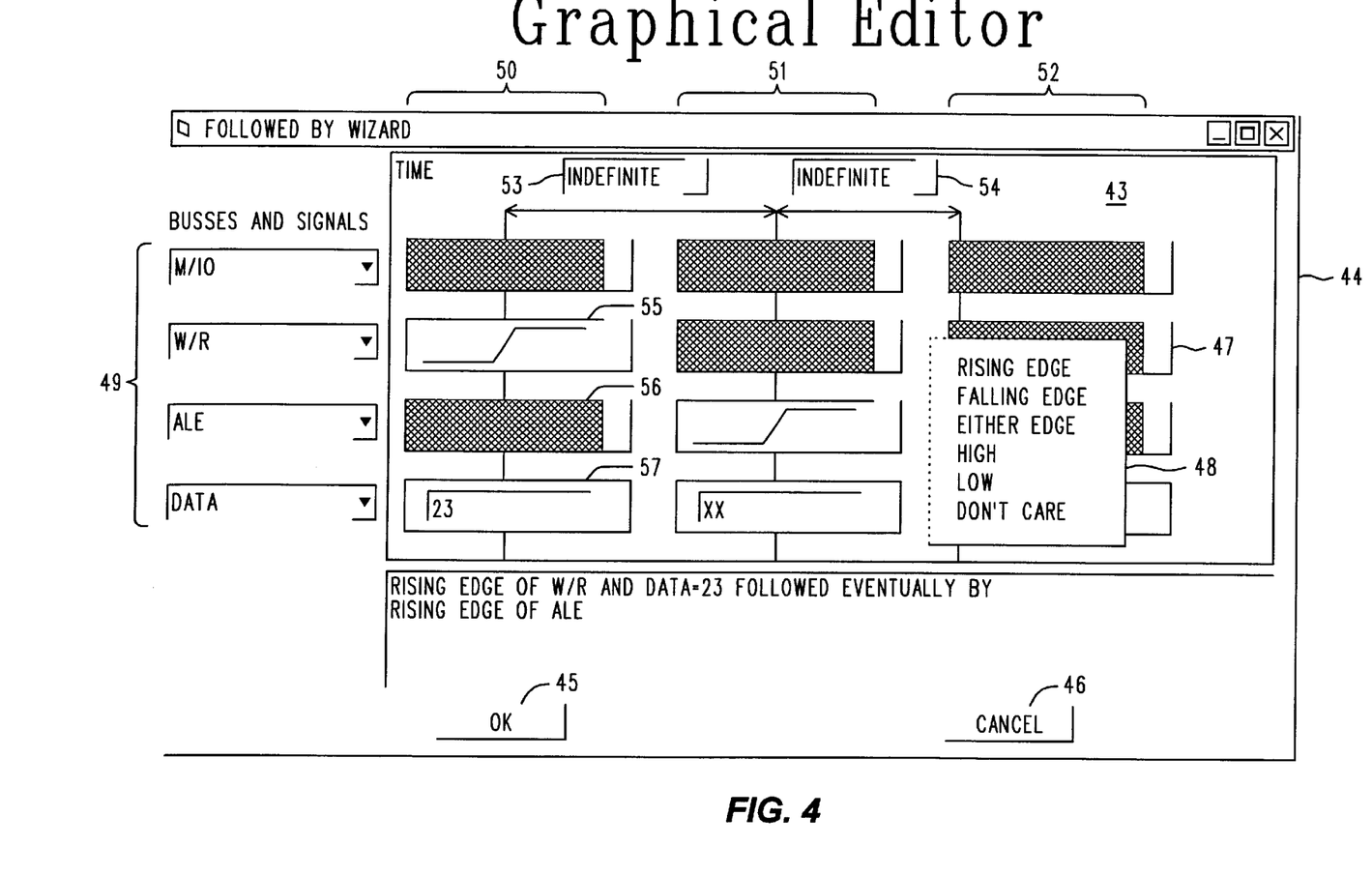
FIG. 4 is a representation of a GUI screen image used in conjunction with creation and editing of a graphical (waveform-like) step in a trigger specification for a logic analyzer constructed in accordance with the invention.

The graphical editor screen 43 allows waveform like descriptions of trigger conditions, and is used to define what we have called the principal meaning or condition of a step in a trigger specification. What to do (Trigger and fill memory, or, Go to <another Step>) is not a waveform like idea, and is subsequently filled out by selecting choices in a menu box 42 (of FIG. 3).

The principal meaning or condition of Step 3 in FIG. 3 is "Find Rising edge of W/R AND DATA=23 followed eventually by Rising edge of ALE". That is, there are individual signals W/R and ALE, and a collection of signals labeled DATA. The condition is met when the signal W/R has a rising edge coincident with the DATA signals representing a value of 23, and then some time later there is a rising edge of ALE. According to menu box 42, when this principal condition is met the analyzer is to trigger and fill memory.

Refer now to FIG. 4, wherein is shown a representation of a graphical editor screen 43 that may be used in performing the definitions described above in connection with Step 3 (37) of FIG. 3. The graphical editor screen 43 resides in a window 44 that appears when icon 39 (of FIG. 3) is clicked upon. Graphical editor screen 43 includes a collection 49 of previously defined signal names and bus names for which the graphical editing mechanism can be used. The collection 49 is arranged vertically (as if it were a column, although we won't call it that, as we prefer to use that word for something else), and appears adjacent a number of entry columns 50, 51 and 52. Each of these columns (50–52) represents later locations in time, when considered from left to right. Each column includes, along its vertical direction, a number of entries: one for each name in the collection 49. Column entries corresponding to the same signal or bus name are at the same height, producing a matrix of rows and columns. The rows are names and the columns are (from left to right) successive instances in time. An entry is the intersection of a row and a column, and can be defined as a condition to be included in a step of a trigger specification. Boxes 55, 56 and 57 are examples. At box 55 an entry has been defined to require a rising edge on the signal W/R; box 56 indicates that the signal ALE is a don't care (at the time the rising edge of W/R occurs); and, at box 57 an entry has been defined to require the bus labeled DATA to exhibit the value twenty-three during the rising edge of the signal W/R. Box 56 (and indeed, all the boxes for the various entries) is initially set to don't care at a first invocation of the of the graphical editor screen 43 for a given step in a trigger specification. Thus, box 56 need not be set explicitly to don't care, unless done to set it back to don't care after earlier having been set to something else. The don't care condition is indicated by a cross hatch pattern for entries corresponding to individual signals, and by the symbols 'xx' for entries corresponding to buses.

In the example shown in FIG. 4, column 51 has an entry for the signal ALE that requires a rising edge. This requirement is an implied "followed by", in that events related to column 51 are expected to occur subsequent to those in column 50. We shall have more to say about this in connection with FIG. 5.

The content of any particular entry, such as 47, is specified by positioning the screen pointer (not shown) over the entry of interest and then clicking. A menu 48 appears over the entry (47), and the pointing device (e.g., a mouse) is used to control the screen pointer to select an entry from that menu. The entries in the menu 48 recite the various possibilities for waveform behavior that can have a corresponding iconic symbol placed into the entry (47). In our example the menu entries are text legends: Rising Edge, Falling Edge, Either Edge, High, Low, and, Don't Care. Instead of such text legends the menu 48 could have been comprised of iconic symbols themselves. We chose to use legends to describe the choices, as this avoids a possible circular definition situation, where an iconic representation of a waveform transition is indicated by itself instead of by text that is descriptive in a human language. It seems a matter of choice whether to make menu 48 contain text or iconic symbols; most users would probably relate well to either.

Figure 5:
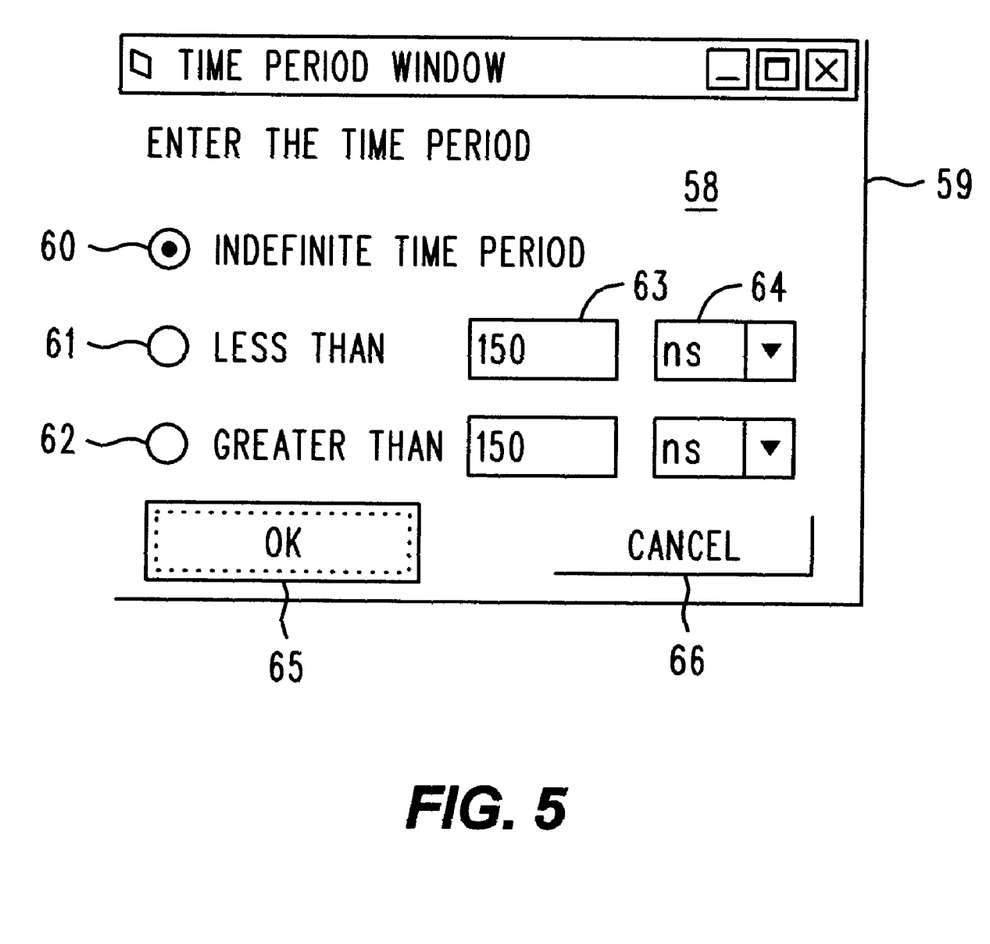
FIG. 5 is a representation of a menu useful in connection with the GUI screen image of FIG. 4.

Now briefly consider FIG. 5. It depicts a menu 58 that appears in a window 59 when either of box 53 or 54 (in FIG. 4) is clicked. Menu 58 allows the implied "followed by" relationship mentioned above to be expressly defined. Initially, it is set to "Indefinite", much as the column entries are initially set to don't care. Menu 58 shows three basic categories: Indefinite time period (60); Less than (61); and, Greater than (62). A conventional Microsoft Windows interface allows selection of one of these choices. If the choice is, say, Less than (61), then a numerically expressed time period is required. It is simply keyed in while the screen pointer is positioned within box 63, while box 64 is itself a small menu box to allow the selection of the unit of time. Choice 62 (Greater than) has similar boxes for the specification of a numeric time interval. Once the desired time relation has been defined for two adjacent columns in FIG. 4 (button 53 for columns 50–51 or button 54 for columns 51–52), menu 58 is concluded by clicking on the OK button 65. If desired, an invocation of menu 58 can be aborted by clicking on Cancel button 66.

In a preferred embodiment more than one entry in a column (51–52) can be defined, so long as the various definitions do not involve more than one transition. Specifying High, Low or Don't Care does not involve requiring a transition, but the choices (in menu 48) Rising Edge, Falling Edge and Either Edge do. The reasons for this are partly technical and partly psychological. Nearly everyone, when considering a waveform presentation that shows two edges, one under the other, takes this to mean that they are occurring (or did occur) at the same time, or if there is a time axis presented, within a time difference discernable by inspection of the separation distance along the axis. This presumption leads naturally to the idea that defining two transitions, one above the other (i.e., as different entries in a column, even if separated by another entry) ought to mean the "AND" (logical conjunction) of the two specified transitions. (It does indeed mean that for any other combination of definitions—only two or more transitions are to be excluded.) The presentation of iconic waveform segments in FIG. 4, however, is not one that is disposed along a genuine graduated time axis. All events within a column are assumed to occur within some quanta of time, whether they actually did, or not. Because of the way the acquisition hardware of the analyzer works, it is difficult or impossible to define a trigger specification step to require the genuine simultaneity of transitions in two separate signals, and the manual for a logic analyzer can be expected to go to some considerable lengths to warn users that they may not get what they bargained for when they make such trigger specifications. (It's not so much that it is absolutely forbidden; the textual definitions will allow it. But the graphical definition, if allowed, would appear to promise more than can be likely expected.) Users familiar with logic analyzers will appreciate this discussion, and will recall that perhaps the best way to get the "AND" of transitions is with the aid of special circuitry at the probe level. In any event, screen 43 of FIG. 4 disallows multiple transitions in a column, even though such "AND'ing" can be specified with the textual definition screen.

A like situation surrounds the topic of specifying the "OR" (logical disjunction) of two waveform conditions, whether transitions or otherwise. A starting point for this discussion is the observation that a particular waveform diagram is, save for regions indicated as don't care, quite definite as to what it describes. There are no generally accepted conventions for depicting alternative circumstances, particularly when there is a sequence of events to be described. (When the corresponding thing happens in a flow chart, it spreads out to embrace all the possibilities. Waveforms don't do that . . . ) Accordingly, trying to intuitively and conveniently indicate "OR" in a graphical definition of a trigger specification step is a bag of snakes that is best left unopened, even though we freely admit that is fair to want to trigger on "waveform event A" OR "waveform event B", where A and B might anything we are otherwise free to define as an entry in a column (50–52) of the graphical editor screen 43. It is true that some indicator of the "OR" condition could be cooked up. Whatever it would be ought to not introduce inconsistency. So, for example, we believe it would be a bad choice to allow multiple transitions to be defined in a column and construe them as transitions to be "OR'ed". It is to much of a "gottcha" for the unwary operator: after all, any other multiple definitions in a column do not mean "OR"; they mean "AND". And if that were implemented anyway, then what would be done to indicate "OR" between non transition events? Too many snakes! Especially so, in view of the fact that the textual definition mechanism handles the "OR" situation with great elegance already. Thus, in the preferred embodiment described herein no "OR" mechanism has been provided for the graphical definition of a trigger specification step.

Refer again to FIG. 4 and observe that the graphical editor screen 43 has three columns, 50–52. In one preferred embodiment these columns simply appear as part of the screen. If one column is sufficient, then the other two are left as don't cares, and all is well. If two are needed, then the left two columns are used and the right-most is left as a don't care. All three columns may be defined, if needed, subject to the availability of what are known as "trigger resources". These are the hardware elements that are reconfigured and deployed by the controlling algorithms within the logic analyzer for the purpose of detecting the trigger event, or desired sequence of events, in real time. These resources contribute to the size, complexity and cost of the logic analyzer, and are generally limited. It is possible to imagine trigger specifications that are beyond the capacity of the analyzer, even though the individual component steps of the trigger specification are within its general capabilities. Such a situation is produced when the analyzer simply does not posses the multiplicity of trigger resources required. Accordingly, it is felt that for the present embodiment, three columns is sufficient, even though it will be admitted that one can contemplate a mechanism for adding, deleting and inserting columns into a screen such as graphical editor screen 43. While that might indeed be done, the practical limit on trigger resources and study data indicating that few users would ever need more than three columns, suggest that our preferred embodiment of three columns is presently sufficient for the vast majority of cases.

We now consider some alternatives to what is depicted in FIG. 3. Recall that we wrote at some length about how step 37 is represented in screen 31 as a non editable readable summary legend. While this is preferred at present, it would not have to always be so. The main impetus is to provide intermixing of textual and graphical definitions. In the list area 33 of screen 31 the textually defined steps (35, 36) are left in their textual form. Step 37 could have been left in its graphical editor form, too. This was in fact tried and tested. It worked, although it consumes screen space at a high rate. There are solutions to that, however, such as multi-page screens and an overlapped display of steps, each in its own window. The screen pointer can bring the desired one to the top by clicking in it. Since the steps are labeled, the order in which they appear or are inspected in a parent window is, in principle, irrelevant. Ordering is nevertheless convenient, however, and a button could be provided to restore the overlapped display to a natural ordering at the conclusion of any editing or inspection. Despite that possibility, another reason suggested using the scheme disclosed: users preferred to see the final results in a generally consistent format, once the definition activities were concluded. We choose to use a format that is similar to the textual one for indications in the list area of graphically defined trigger specification steps (such as step 37). That met the user preference indicated by the testing, but preserved a readily recognizable indication of the graphical origins of the step. In our preferred embodiment, Edit button 41 and the services of the graphical editor screen 43 are needed to alter a graphically defined step.

That last statement leads to another consideration. If, as is indeed true, the textual definition mechanism can define anything that the graphical definition can (the latter is a functional subset of the former), then why not simply indicate all final definitions in the list area as textual, and then edit any step either textually or graphically, as desired. In principle, this could be done, but is a can of worms. First, we have seen that there are circumstances that simply do not lend themselves to presentation both formats: e.g., If/Then/Else and Go To constructs are not related to waveforms. Also, indicating multiple occurrence of things in a waveform format could easily get out of hand, too. Second, there are other circumstances (involving "OR'ing" and the real meaning of "AND'ing") that are awkward or misleading when presented as iconic representation of waveform behavior. For these reasons it was decided not to support the mapping of textually defined steps into the graphical mechanism; there are too many exceptions and loose ends. Such an environment actually fosters operator error, and tends to produce frustration rather than provide help and intuitive ease of use. It was therefore decided that graphically defined trigger specification steps should be edited graphically, and that in turn led to the desirability of making the final textual and graphical results in the list area be readily distinguishable, so as to facilitate the selection of the appropriate editing mechanism.

We claim:

1. Triggerable signal acquisition and display apparatus comprising:

signal acquisition circuitry coupleable to a plurality of work signals in a work system;

a memory coupled to the signal acquisition circuitry and that stores acquired signal values;

a trigger circuit coupled to the signal acquisition circuitry and to the memory, and that terminates the storing of acquired signal values in a selected way in response to the occurrence in the plurality of work signals of events described as ordered steps in a trigger specification;

a graphical user interface defining the steps of a trigger specification, the grahical user interface itself comprising:

a display upon which screens of information are presented, which screens include a screen pointer;

a pointing device coupled to the display and that controls the position of the screen pointer within a screen;

a trigger specification screen including a list area containing component steps in a trigger specification, and also including a collection of icons, at least one of the icons representing a trigger specification component step to be defined by written text and at least one other of the icons representing a trigger specification component step to be defined by iconic symbols representing waveform activity;

wherein a component step appears in the list area when its associated icon in the collection thereof is invoked, and further wherein menus associated with the component steps are used to specify events of interest in the trigger specification component step thus produced, the menu for a component step to be defined by written text containing selectable sections of text and the menu for a component step to be defined by iconic symbols containing selectable iconic symbols representing waveform activity; and wherein a completed menu for defining a component step with selectable iconic symbols is replaced in the list of component steps by a summarizing readable legend of text once the definition with selectable iconic symbols of the associated component step is completed.

* * * * *